(12) United States Patent
Takayama

(10) Patent No.: US 6,170,640 B1
(45) Date of Patent: Jan. 9, 2001

(54) CARRYING SYSTEM AND CARRYING METHOD

(75) Inventor: Yukio Takayama, Kasugai (JP)

(73) Assignee: Fujitsu Limited, Kawasaki (JP)

( * ) Notice: Under 35 U.S.C. 154(b), the term of this patent shall be extended for 0 days.

(21) Appl. No.: 09/014,244

(22) Filed: Jan. 27, 1998

(30) Foreign Application Priority Data

Jun. 20, 1997 (JP) .................................................. 9-164425

(51) Int. Cl.[7] .................................................. B65G 25/00
(52) U.S. Cl. .................................. 198/468.2; 198/468.6; 414/416; 414/417; 414/753.1
(58) Field of Search .................. 414/222.01, 222.08, 414/222.13, 225.01, 226.01, 226.02, 416, 417, 937, 749.1, 751.1, 752.1, 753.1; 198/468.2, 468.6, 468.01; 901/8, 16

(56) References Cited

U.S. PATENT DOCUMENTS

| | | | |
|---|---|---|---|
| 4,638,904 | * 1/1987 | Randar | 198/468.2 |
| 4,875,824 | * 10/1989 | Moe et al. | 901/8 X |
| 5,564,889 | * 10/1996 | Araki | 414/222.01 |

* cited by examiner

*Primary Examiner*—Donald W. Underwood
(74) *Attorney, Agent, or Firm*—Armstrong, Westerman, Hattori, McLeland & Naughton

(57) ABSTRACT

A carrying system for carrying a lead frame of a semiconductor device includes first and second carriers located on the same side of a carrier line, one carrier located above the other carrier. The first and second carriers are movable from along the carrier line, from a start point to a processing area and to an end point. The first and second carriers each include a holder for holding the lead frame on a specific end of the lead frame. By holding the lead frame on the same side of the carrier line and at a specific end of the lead frame, holding position deviation is minimized.

19 Claims, 5 Drawing Sheets

Fig.1 (PRIOR ART)
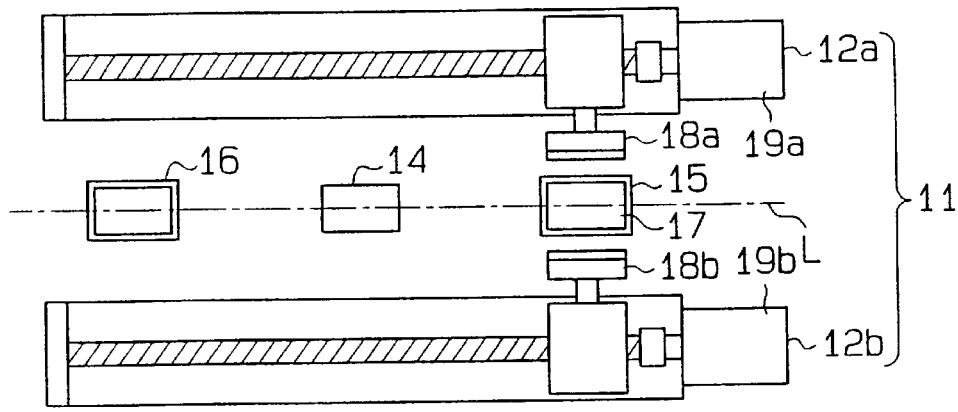
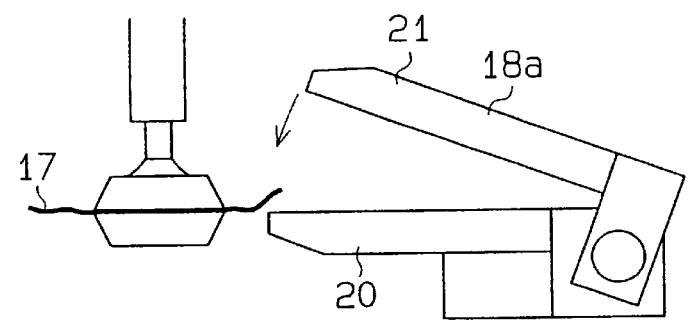
Fig.2(a) (PRIOR ART)
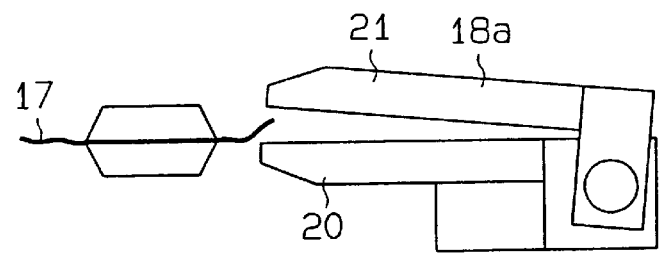
Fig.2(b) (PRIOR ART)
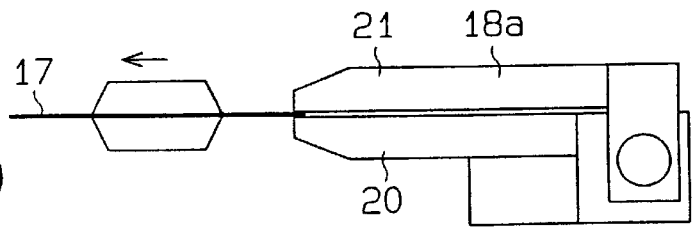
Fig.2(c) (PRIOR ART)

CARRYING SYSTEM AND CARRYING METHOD

BACKGROUND OF THE INVENTION

The present invention relates to a carrying system and a carrying method for positioning and carrying a frame of a semiconductor device or the like.

In fabricating a semiconductor device, a carrying system for carrying the frame of an IC is employed. The carrying system is used with a processing unit such as a laser marker for marking the package of a semiconductor device. In recent years, the integration degree of semiconductor devices has increased. In addition, many types of semiconductor devices are now fabricated. Thus, a carrying system for carrying semiconductor devices must not only cope with various types of semiconductor devices, but also control the positional deviation of a lead frame being carried.

FIG. 1 shows a schematic top view of a conventional carrying system.

As shown in FIG. 1, a carrying system 11 is provided with a pair of carriers 12a and 12b. The carriers 12a and 12b are set at the same height. The carriers 12a and 12b are provided with holders 18a and 18b, respectively. In addition, the carriers 12a and 12b are provided with motors 19a and 19b for moving the holders 18a and 18b, respectively. Magazines 15 and 16 are provided between the carriers 12a and 12b. One magazine 15 accommodates a lead frame 17.

The carrying operation of the frame 17 of the semiconductor device is controlled by a controller (not illustrated) as described below. First, the controller moves one holder 18a from a standby position (position shown in FIG. 1) toward the lead frame 17 disposed in the magazine 15, to hold one side of the lead frame 17. At this time, the holder 18a holds the left side of the lead frame 17 with respect to the moving direction. The controller moves the holder 18a by driving the motor 19a to carry the lead frame 17 to a processing position 14 along a carrying line L. At the processing position 14, a processing unit (not illustrated) processes the frame 17. After processing of the frame 17 is completed, the controller moves the holder 18a to thereby carry the frame 17 to the magazine 16. After moving of the frame 17 to the magazine 16 is completed, the controller moves the holder 18a on the carrying line L to a standby position.

While the holder 18a moves the magazine 16 from the processing position 14, the other holder 18b moves another frame 17 in the magazine 15 to the processing position 14. At this time, the holder 18b holds the right side of the frame 17 with respect to the moving direction. After the frame 17 is processed by the processing unit, the holder 18b moves the frame 17 to the magazine 16. At this time, the holder 18a returns to the initial position to hold the next frame 17 in the magazine 15. Thus, the carrying system 11 carries the frames 17 alternately using the two holders 18a and 18b. The alternate carrying decreases the time between processing of one frame 17 and processing of the next frame 17, thereby improving the throughput of frame carrying.

However, the following problem occurs when a clamping operation of the lead frame 17 is performed. As shown in FIGS. 2A to 2C, the holder 18a rotates a movable damper 21 against a fixed damper 20 to hold the lead frame 17. When the lead frame 17 is deflected, the position of the lead frame 17 is deviated leftward in FIG. 1 (direction perpendicularly intersecting the carrying line L) because the movable damper 21 pushes the lead frame 17. Thus, the lead frame 17 is moved to the processing position 14 while having a positional deviation.

Similarly, when the holder 18b holds the lead frame 17, the position of the lead frame 17 deviates rightward. The directions of the positional deviations of the lead frame 17 caused by the holders 18a and 18b are opposite to each other. Therefore, the range in which the lead frame 17 is position-deviated from the processing position 14 is equal to a value obtained by adding the positional-deviation value due to the carrier 12a and the positional-deviation value due to the carrier 12b. For example, when assuming that the positional-deviation values due to the carriers 12a and 12b are roughly the same, the range in which the lead frame 17 can be position-deviated at the processing position 14 is twice as large as the positional-deviation values due to each carrier 12a and 12b. As the range in which the lead frame 17 can be position-deviated increases, it is necessary to further expand the range for detecting the position of the frame 17 to perform an alignment of the lead frame 17 at the processing position 14. Such expansion of the detection range lowers the accuracy for performing alignment of the lead frame 17 at the processing position 14.

Referring to FIG. 3, a stream mark 22 of resin used for sealing a semiconductor chip or a part of a runner may be left on the lead frame 17. Therefore, the position for clamping the frame 17 is further deviated or the frame 17 cannot be securely held due to the resin.

It is an object of the present invention to provide a carrying system and a carrying method capable of reducing a positional deviation value without decreasing the throughput of frame carrying.

SUMMARY OF THE INVENTION

To achieve the above objective, the present invention provides a carrying system for carrying a frame of a semiconductor device provided at a start point of a carrying line to an end point of the carrying line, the carrying system comprising: a first carrier movable along the carrying line to carry the frame; and a second carrier movable along the carrying line to carry the frame, the second carrier located below the first carrier; wherein the first and second carriers are located on the same side of the carrying line and hold a specific end of the frame when carrying the frame.

The present invention further provides a carrying system for carrying a frame of a semiconductor device from a start point of a carrying line to an end point of the carrying line, comprising: a first carrier movable along the carrying line for carrying the frame; and a second carrier movable along the carrying line and located below the first carrier, for carrying the frame, each carrier including; a holding member for holding a specific end of the frame, a first stage for moving the holding member along the carrying line, and a second stage for moving the holding member in a direction perpendicular to the carrying line, wherein the first and second carriers are located on the same side of the carrying line to alternately carry and hold the specific end of the frame, when carrying the frame.

The present invention provides a carrying method for carrying a frame of a semiconductor device provided at a start point of a carrying line, comprising the steps of: providing a first carrier for carrying the frame; providing a second carrier on the same side of the carrying line as the first carrier and at a position below the first carrier; holding a specific end of the frame with the first carrier; moving the first carrier to an end point of the carrying line; holding the specific end of the frame with the second carrier; and moving the second carrier to the end point of the carrying line.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

FIG. 1 is a schematic top view showing a conventional carrying system;

FIG. 2A is an enlarged view showing the clamping operation of a frame;

FIG. 2B is an enlarged view showing the clamping operation of the frame;

FIG. 2C is an enlarged view showing the clamping operation of the frame;

DETAILED DESCRIPTION OF THE PREFERRED EMBODIMENTS

Figure 3:
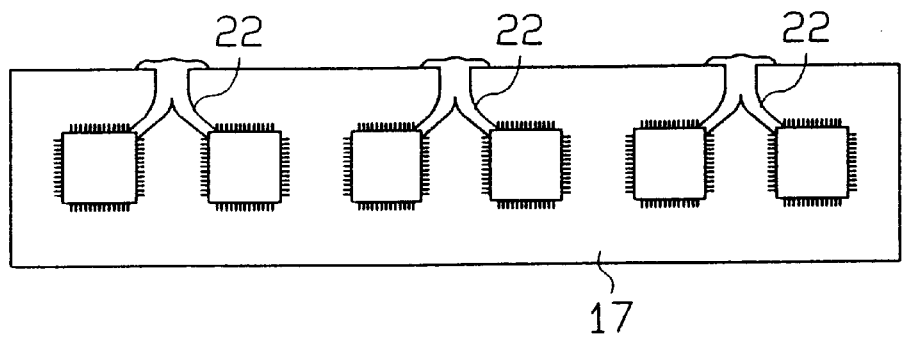
FIG. 3 is a schematic plan view showing the frame sealed with resin.

Certain terminology is used in the following description for convenience only and is not limiting. The words "right", "left", "lower" and "upper" designate directions in the drawing to which reference is made. The terminology includes the words above specifically mentioned, derivations thereof, and words of similar import.

An embodiment of the present invention will be described below by referring to FIGS. 4 to 8. In the drawing, like numerals are used for like elements throughout.

Figure 4:
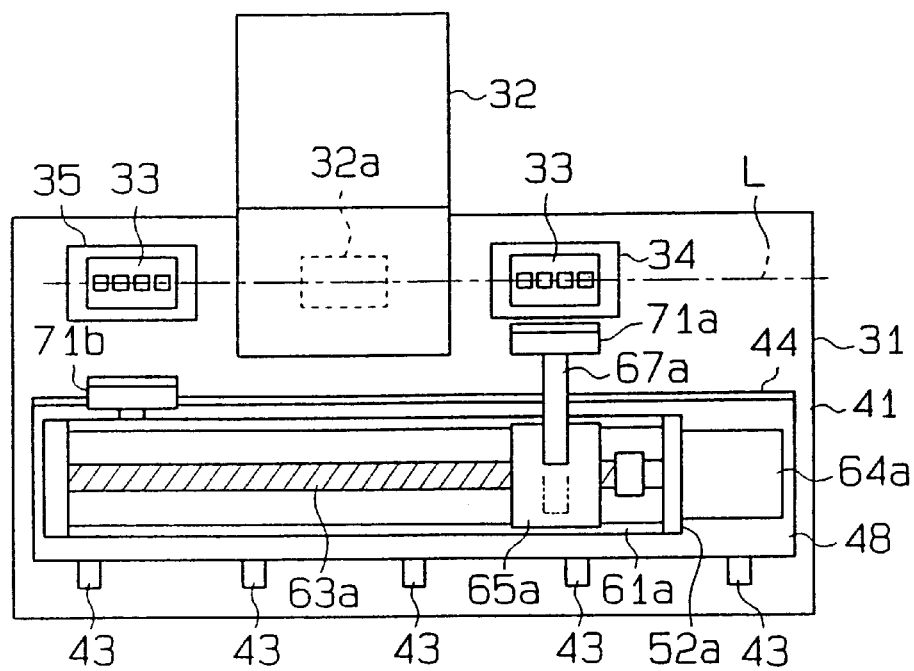
FIG. 4 is a top plan view showing a carrying system of an embodiment of the present invention.
Figure 6:
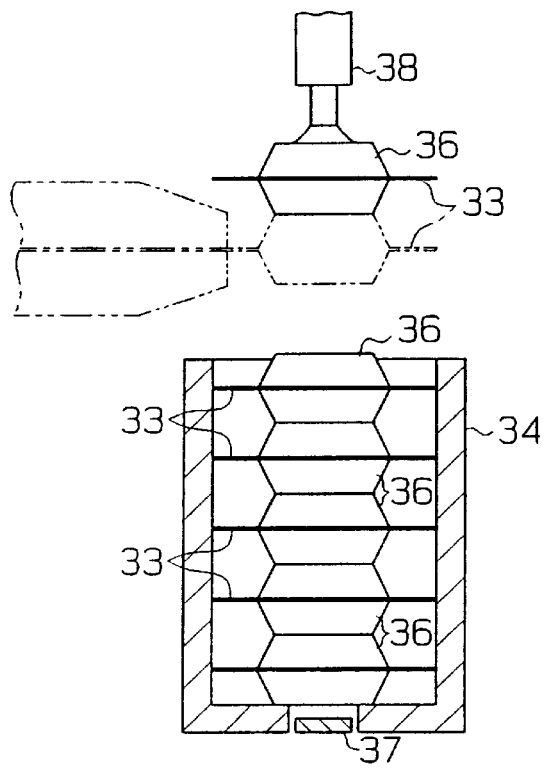
FIG. 6 is a diagram showing the delivery operation of an IC frame.

As shown in FIG. 4, a carrying system 31 operates to carry a lead frame 33 to be processed by a laser marker 32. The carrying system 31 is provided with first and second magazines 34 and 35 arranged on opposing sides of the laser marker 32 (right and left sides in FIG. 4). As shown in FIG. 6, the first magazine 34 accommodates a plurality of lead frames 33. The carrying system 31 carries the lead frames 33 disposed in the first magazine 34 to the laser marker 32. Each lead frame 33 supports a package 36. A chip (not illustrated) is sealed in the package 36 with resin.

An elevator fork 37 is set below the first magazine 34. The elevator fork 37 raises the lead frames 33 in the first magazine 34 upward one by one. An attractor 38 disposed above the first magazine 34 attracts the highest lead frame 33 and raises the lead frame 33 up to a predetermined position above the first magazine 34. The carrying system 31 holds an end of the attracted lead frame 33 and carries the lead frame 33 up to a processing position 32a (FIG. 4) of the laser marker 32.

The laser marker 32 performs marking of the package 36 of the lead frame 33 with characters. The carrying system 31 carries the processed lead frame 33 to the second magazine 35. Herein, the route (shown by a chain line in FIG. 4) from the first magazine 34 to the second magazine 35 is defined as a carrying line L.

Figure 5:
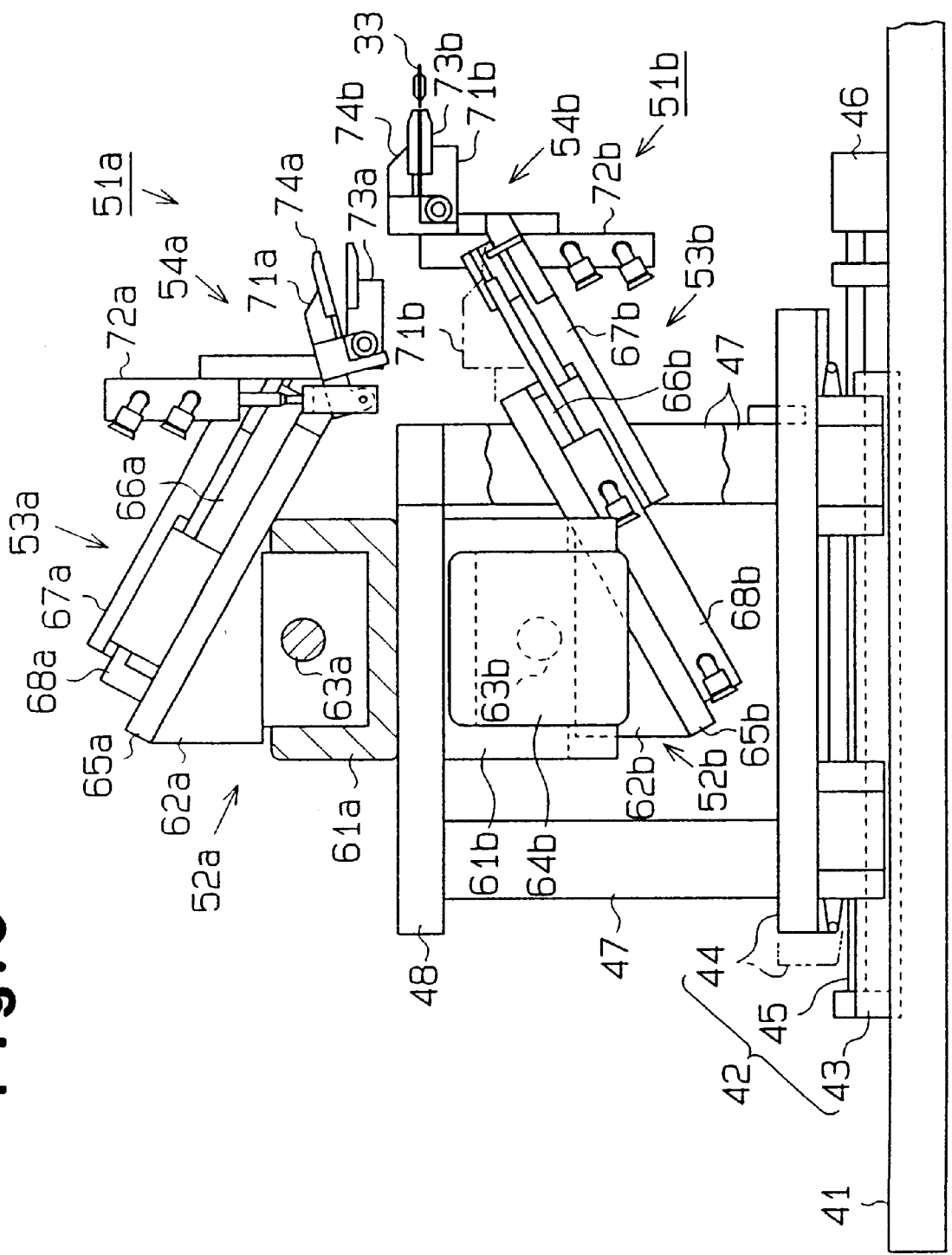
FIG. 5 is a side elevational view partially in cross-section of the carrying system of FIG. 4.

As shown in FIG. 5, the carrying system 31 includes a first base 41. The first base 41, as shown in FIG. 4, comprises a rectangular plate extending along the carrying line L. The upper side of the first base 41 is provided with a stage 42. The stage 42 comprises a rail 43, a table 44, a ball screw 45, and a servomotor 46. The rail 43 extends along the direction perpendicular to the carrying line L on the first base 41. The table 44 is movable along the rail 43. The motor 46 provided for moving the table 44, is set on the first base 41. The ball screw 45 is provided along the rail 43 and connected to the motor 46. When the motor 46 rotates the ball screw 45, the table 44 moves along the rail 43.

The carrying system 31 is also provided with a plurality of supports 47 vertically set on an upper side of the table 44. A second base 48 is secured to the top ends of the supports 47. The second base 48, as shown in FIG. 4, comprises a rectangular plate extending along the carrying line L.

An upper carrier 51a is provided for the upper side of the second base 48 and a lower carrier 51b is provided for the lower side of the second base 48 each of the carriers 51a and 51b is provided with first stages 52a and 52b, second stages 53a and 53b, and holders 54a and 54b. The first stages 52a and 52b move the holders 54a and 54b along the carrying line L and the second stages 53a and 53b move the holders 54a and 54b in the direction perpendicular to the carrying line L. The second stage 53a of the upper carrier 51a moves the holder 54a from the diagonally upper side of the lead frame 33 (diagonally upper left side in FIG. 5). The second stage 53b of the lower carrier 51b moves the holder 54b from the diagonally lower side of the lead frame 33 (diagonally lower left side in FIG. 5). To move the holders 54a and 54b, a plurality of second stages 53a and 53b may be provided. The holders 54a and 54b position and hold the lead frame 33.

The carriers 51a and 51b move the holders 54a and 54b, respectively, toward the lead frame 33 from the same side relative to the lead frame 33 (left side in FIG. 5). Further, the holders 54a and 54b hold the same side of the lead frame 33. Therefore, if the lead frame 33 is bent, the deviated directions of the lead frame 33 due to the holders 54a and 54b are the same (rightward in FIG. 5).

Figure 8A:
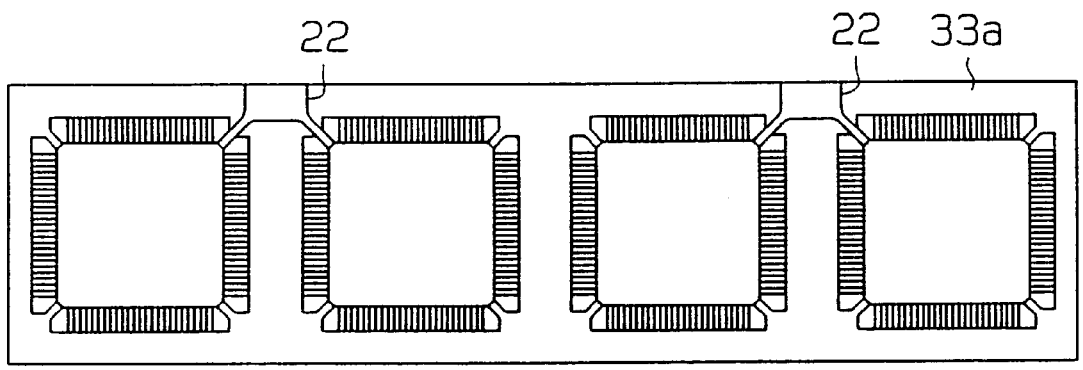
FIG. 8A is a top plan view of a first IC frame.
Figure 8B:
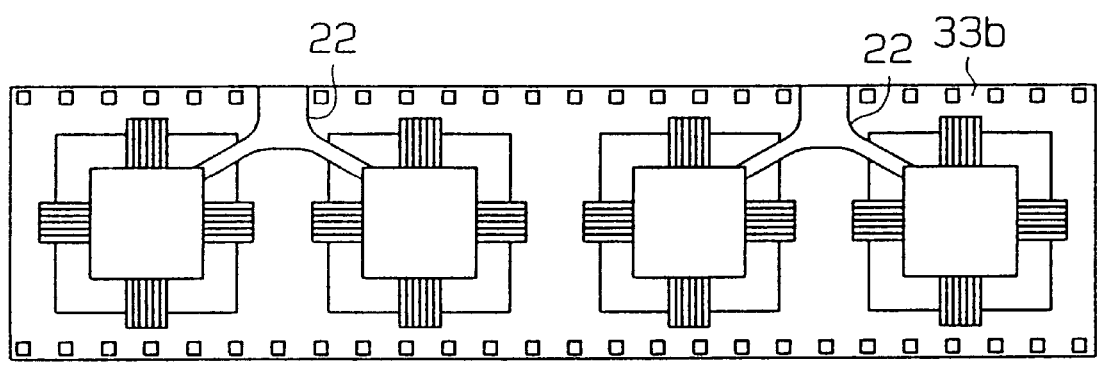
FIG. 8B is a top plan view of a second IC frame.

As shown in FIGS. 8A and 8B, the lead frames 33 generally have a resin stream mark 22 produced when forming the package 36 through resin sealing. Each frame 33 is disposed in the first magazine 34 so that the stream mark 22 is located at one side (here the right side) of FIG. 5. Therefore, the holders 54a and 54b hold the side of the lead frame 33 opposite to the side of the frame 33 on which the stream mark 22 is formed (lower side in FIGS. 8A and 8B). Thereby, the lead frame 33 is securely held by the holders 54a and 54b and the positional deviation of the lead frame 33 due to the stream mark 22 is prevented.

The structures of the carriers 51a and 51b are described below by referring to FIG. 5.

The first stage 52a of the upper carrier 51a comprises a guide rail 61a, a movable body 62a, a ball screw 63a, a servomotor 64a, and a base 65a. The guide rail 61a extends along the carrying line L. The movable body 62a is movably supported by the guide rail 61a along the carrying line L. The ball screw 63a extending along the carrying line L is connected to the movable body 62a. The servomotor 64a (FIG. 4) is connected to one end of the ball screw 63a.

Rotation of the ball screw 63a by the servomotor 64a moves the movable body 62a along the carrying line L. The upper side of the movable body 62a slopes toward the carrying line L. The base 65a is secured to the upper side of the movable body 62a. Therefore, as the movable body 62a moves, the base 65a moves along the carrying line L while tilted or sloped position. The tilt of the upper side of the base 65a is set corresponding to the moving direction of the holder 54a moving along the upper side of the base 65a.

The second stage 53a is provided for moving the holder 54a. The second stage 53a is provided with a rail 66a, a base 67a, and a first cylinder 68a. The rail 66a and the first cylinder 68a are disposed on the upper side of the base 65a of the first stage 52a. The rail 66a extends in the direction perpendicular to the carrying line L. The base 67a is provided on the rail 66a, and is movable along the rail 66a. The front end of a rod of the first cylinder 68a is secured to the base 67a. Therefore, when the rod of the first cylinder 68a moves forward or backward, the base 67a moves along the rail 66a.

The holder 54a is set to the front end (the end at the carrying line side) of the base 67a of the second stage 53a. The holder 54a is provided with a damper 71a and a second cylinder 72a. The clamper 71a is provided with a fixed damper 73a and a movable damper 74a. The fixed damper 73a is secured to the front end of the base 67a and the movable damper 74a is movably secured for pivotal movement to the fixed damper 73a.

The second cylinder 72a operates to rotate or pivot the movable damper 74a with respect to the fixed damper 73a. The movable damper 74a is set to the front end of the rod of the second cylinder 72a. When the rod of the second cylinder 72a moves forward or backward (ie up or down), the movable damper 74a pivots and the damper 71a opens or closes. When the damper 71a closes, the lead frame 33 is held therein.

The lower carrier 51b has the same structure as the upper carrier 51a, and the carriers 51b and 51a are arranged symmetrically to a plane including the carrying line L of the lead frame 33. Therefore, the description of the structure of the lower carrier 51b is omitted, as it's operation will be readily apparent to one of ordinary skill in the art. Each member of the upper carrier 51a is provided with symbol "a" and each member of the lower carrier 51b corresponding to each member of the carrier 51a is provided with symbol "b". In the case of the lower carrier 51b, the holder 54b moves along the tilted direction at the lower side of the base 65b. It is understood that other driving means such as motors or solenoids can be used instead of the cylinders 68a, 68b, 72a, and 72b.

Figure 7:
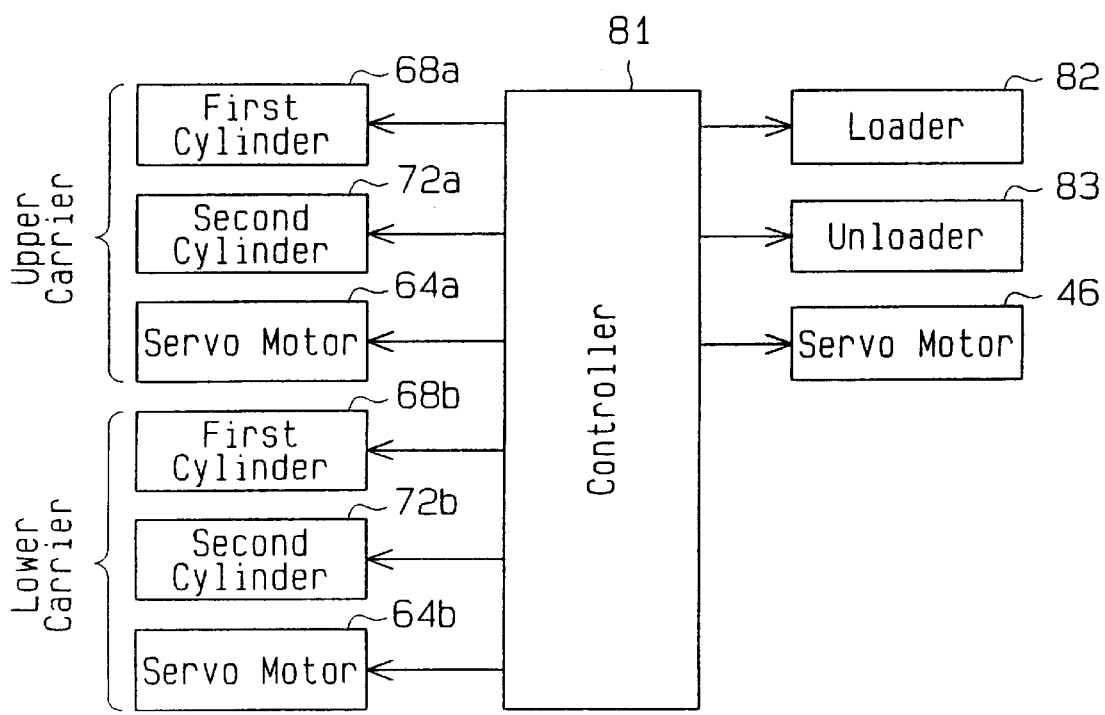
FIG. 7 is a block diagram showing the electrical structure of carrying system of FIG. 4.

As shown in FIG. 7, the carrying system 31 includes a controller 81. The servomotors 64a and 64b and the cylinders 68a, 68b, 72a, and 72b are connected to the controller 81. The controller 81 allows the carriers 51a and 51b to perform the carrying operation. The carrying operation includes an operation for moving the holders 54a and 54b from a standby position to positions (holding positions) capable of holding the lead frames 33, respectively and an operation for moving the lead frame 33 to the second magazine 35 along, the carrying line L.

In addition, the controller 81 permits the carriers 51a and 51b to perform the forwarding operation. The forwarding operation includes an operation for moving the holders 54a and 54b from the carrying line L after completion of carrying of the lead frames 33 and an operation for moving the holders 54a and 54b up to their standby position.

Furthermore, the controller 81 makes the both carriers 51a and 51b alternately perform the carrying operation and the forwarding operation. The controller 81 makes the lower carrier 51b perform the forwarding operation while making the upper carrier 51a perform the carrying operation. Moreover, the controller 81 makes the lower carrier 51b perform the carrying operation while making the upper carrier 51a perform the forwarding operation. Therefore, because the upper carrier 51a and the lower carrier 51b alternately perform the carrying operation, the index time of the lead frame 33 is equal to the index time of the conventional carrying system 11.

In addition, a loader 82 and an unloader 83 are connected to the controller 81. The loader 82 delivers the lead frames 33 disposed in the first magazine 34 to the carriers 51a and 51b. The unloader 83 receives the lead frames 33 from the carriers 51a and 51b and places the lead frame 33 in the second magazine 35.

The controller 81 successively delivers the lead frames 33 disposed in the first magazine 34 to the carriers 51a and 51b by controlling the loader 82. The controller 81 receives the carried lead frames 33 and places the lead frames them in the second magazine 35 by controlling the unloader 83.

The motor 46 for moving the stage 42 is connected to the controller 81. The lead frames 33a/33b differ in sizes (widths) as shown in FIGS. 8A and 8B depending on the difference between types of lead frames due to materials used and package sizes (numbers of pins per packages). Therefore, the controller 81 moves the stage 42 in the direction perpendicular to the carrying line L by driving the motor 46 in accordance with the type of the lead frame 33. The movement of the stage 42 adjusts the interval between the holders 54a and 54b and the carrying line L. With such an adjustment, the central position of the lead frame 33 is aligned with the carrying line L irrespective of the type of lead frame 33. Thus, various types of lead frames 33 may be carried on the same carrying line L by the carrying system 31. That is, the carrying system 31 can cope with various types of lead frames 33.

The operation of the carrying system 31 will be described below.

First, the first magazine 34 in which the lead frames 33 are disposed and the empty second magazine 35 are sent to the carrying system 31. The controller 81 controls the loader 82 to pick up the lead frames 33. Specifically, the controller 81 raises the lead frames 33 in the first magazine 34 using the elevator fork 37. The attractor 38 attracts the highest lead frame 33, under the control of the controller 81. The controller 81 raises the highest lead frame 33 up to a predetermined position (position shown by a solid line in FIG. 6). The side wall of the first magazine 34 serves as a guide so that when the lead frame 33 is picked up, it is also positioned.

Then, the controller 81 moves the holders 54a and 54b of the upper carrier 51a from their standby positions to holding positions by controlling the first cylinder 68a. The controller 81 also lowers the lead frame 33 to a position (position shown by the two-dot chain line in FIG. 6) where the lead frame 33 can be held by the holder 54a. Then, the controller 81 closes the damper 71a by controlling the second cylinder to hold the lead frame 33. In this case, the soft lead frame 33 may be loosened. If the lead frame 33 is loosened, the lead frame 33 is deviated in the direction away from the holder 54a (right side of the carrying direction) when holding the lead frame 33 with the holder 54a.

The controller 81 also moves the upper carrier 51a along the carrying line L by driving the servomotor 84a to carry the lead frame 33 to the processing position 32a of the laser marker 32. The laser marker 32 minutely performs the alignment of the carried lead frame 33. Specifically, the laser marker 32 image-recognizes the position of the lead frame 33. Then, the laser marker 32 marks a predetermine position of the lead frame 33 (predetermined position of the package) by controlling a laser beam in accordance with the position of the recognized lead frame 33.

Then, the controller 81 carries the processed lead frame 33 to the second magazine 35 along the carrying line L. The controller 81 makes the unloader 83 hold the lead frame 33 by controlling the unloader 83. Then, the controller 81 opens the damper 71a by controlling the second cylinder 72a. Thereafter, the controller 81 makes the upper carrier 51a perform the forwarding operation to return the upper carrier 51a to its standby position. The controller 81 then stores the lead frame 33 in the second magazine 35 by controlling the unloader 83.

The controller 81 also controls the lower carrier 51b, similar to the case of the upper carrier 51a, as described above. The controller 81 makes the lower carrier 51b perform the carrying operation while making the upper carrier 51a perform the forwarding operation. Thus, by making the upper carrier 51a and the lower carrier 51b alternately perform the carrying operation, the index time of the lead frame 33 is equal to that of the conventional carrying system 11. Therefore, the throughput for carrying the frame 17 is maintained.

When the lower carrier 51b carries the lead frame 33, the holder 54b holds one side of the lead frame 33. At this time, if the lead frame 33 is bent, the lead frame 33 deviates in the direction separating it from the holder 54b (right side of the carrying direction). The deviating direction of the lead frame 33 is the same as the direction when the lead frame 33 is held by the holder 54a of the upper carrier 51a. Thus, even if the lead frame 33 is carried by any of the carriers 51a and 51b, the lead frame 33 deviates only in a specific direction. When the lead frame 33 deviates by a certain distance, the range in which the frame 33 deviates is halved in the case of the carrying system 31 of the present invention compared with the convention system 11, in which case holding of both sides of the frame 33 occurs.

Further, when the lead frame 33 is set to the processing position 32a, the lead frame 33 may deviate to the right side of the carrying direction from the carrying line L. Because the range in which the frame 33 deviates is decreased compared with the range of deviation in the conventional system 11, it is possible to decrease the detection range for recognizing the position of the lead frame 33. Decreasing the detection range simplifies the alignment of the frame 33.

The carrying system 31 is provided with two carriers 51a and 51b on only one side (the left side) of the carrying direction. This simplifies the structure of the system 31 compared with the conventional carrying system 11 provided with the carriers 12a and 12b at the both sides of the carrying direction, and also allows for a smaller carrying system.

The present examples and embodiment are to be considered as illustrative and not restrictive, and the invention is not to be limited to the details given herein, but may be modified within the scope and equivalence of the appended claims.

What is claimed is:

1. A carrying system for carrying frames of semiconductor devices provided at a start point of a carrying line to an end point of the carrying line, the carrying system comprising:

a first carrier movable along the carrying line to carry a first frame; and a second carrier movable along the carrying line, independent of the movement of the first carrier along the carrying line, to carry a second frame, the second carrier located below the first carrier;

wherein the first and second carriers are located on the same side of the carrying line and hold a predetermined end of the frames when carrying the respective frames.

2. The carrying system according to claim 1, further comprising a controller for controlling the operation of first and second carriers, wherein the controller causes the first and second carriers to alternately carry the respective frames.

3. The carrying system according to claim 2, further comprising a processing unit for processing the frames in a processing area located between the start point and the end point of the carrying line.

4. The carrying system according to claim 3, wherein each of the first and second carriers includes:

a holding member for holding the predetermined ends of the respective frames;

a first stage for moving the holding member along the carrying line, and a second stage for moving the holding member in a direction perpendicular to the carrying line, the second stage moving the holding member between a holding position and a standby position.

5. The carrying system according to claim 4, wherein the holding positions of each carrier are the same, and the standby position of the first carrier is located diagonally above the holding position of the first carrier and the standby position of the second carrier is located diagonally below the holding position of the second carrier.

6. The carrying system according to claim 4, wherein the holding member includes a fixed clamper, a movable clamper movable with respect to the fixed clamper, and a driver for operating the movable clamper.

7. The carrying system according to claim 4, further comprising:

a base for supporting the first and second carriers and;

a third stage for moving the base in the direction perpendicular to the carrying line, wherein the controller adjusts in interval between the carrying line and each of the holding members by moving the third stage.

8. The carrying system according to claim 4, further comprising a first magazine provided at the start point of the carrying line to accommodate a plurality of the frames and a second magazine provided at the end point of the carrying line for holding processed frames.

9. A carrying system for carrying frames of semiconductor devices from a start point of a carrying line to an end point of the carrying line, comprising:

a first carrier movable along the carrying line for carrying a first frame; and a second carrier movable along the carrying line and located below the first carrier, for carrying a second frame, each carrier including;

a holding member for holding a predetermined end of the respective frames;

a first stage for moving the holding member along the carrying line, a second stage for moving the holding member in a direction perpendicular to the carrying line, wherein the first and second carriers are located on the same side of the carrying line and both said carriers alternately hold and carry respective frames along the carrying line, and a controller for controlling the movement of each carrier between a holding position and a standby position, wherein the holding position of each carrier is the same, and the standby position of the first carrier is located diagonally above the holding position of the first carrier and the standby position of the second carrier is located diagonally below the holding position of the second carrier.

10. The carrying system according to claim 9, further comprising a processing unit for processing the frames in a processing area located between the start point and the end point of the carrying line.

11. A carrying method for carrying frames of semiconductor devices provided at a start point of a carrying line, comprising the steps of:

providing a first carrier for carrying a first frame;

providing a second carrier on the same side of the carrying line as the first carrier and at a position below the first carrier, for carrying a second frame;

holding a predetermined end of the first frame with the first carrier;

moving the first carrier from the start point to an end point of the carrying line;

holding a predetermined end of the second frame with the second carrier; and after the first carrier has moved away from the start point, moving the second carrier from the start point to the end point of the carrying line.

12. The carrying method according to claim 11, further comprising the steps of:

each of the first and second carriers carrying the respective frames to a processing area located between the start point and the end point of the carrying line; and processing the respective frames in the processing area.

13. The carrying method according to claim 11, further comprising the steps of:

moving the first carrier diagonally downward from a standby position of the first carrier to hold the first frame; and moving the second carrier diagonally upward from a standby position of the second carrier to hold the second frame.

14. The carrying method according to claim 11, further comprising the step of carrying the first and second frames alternately with the first and second carriers.

15. The carrying method according to claim 14, further comprising the steps of:

moving the first carrier to the end point of the carrying line and thereafter moving the second carrier to the end point of the carrying line;

moving the first carrier to the start point of the carrying line while moving the second carrier to the end point of the carrying line; and moving the second carrier to the start point of the carrying line while moving the first carrier to the end point of the carrying line.

16. The carrying method according to claim 11, further comprising the step of adjusting an interval between the carrying line and each holding member by moving the first and second carriers in a generally perpendicular direction with respect to the carrying line.

17. A carrying system for carrying frames of semiconductor devices from a start point of a carrying line to an end point of the carrying line, comprising:

a first carrier movable along the carrying line for carrying a first frame; and a second carrier movable along the carrying line and located below the first carrier, for carrying a second frame, each carrier including;

a holding member for holding a predetermined end of the respective frames, said holding member including a fixed clamper, a movable clamper pivotable about the fixed clamper, and a driver for operating the movable clamper;

a first stage for moving the holding member along the carrying line;

a second stage for moving the holding member in a direction perpendicular to the carrying line, wherein the first and second carriers are located on the same side of the carrying line and both said carriers alternately hold and carry respective frames along the carrying line; and a processing unit for processing the frames in a processing area located between the start point and the end point of the carrying line.

18. A carrying system for carrying frames of semiconductor devices from a start point of a carrying line to an end point of the carrying line, comprising:

a first carrier movable along the carrying line for carrying a first frame; and a second carrier movable along the carrying line and located below the first carrier, for carrying a second frame, each carrier including;

a holding member for holding a predetermined end of the respective frames, a first stage for moving the holding member along the carrying line, a second stage for moving the holding member in a direction perpendicular to the carrying line, wherein the first and second carriers are located on the same side of the carrying line and both said carriers alternately hold and carry respective frames along the carrying line;

a processing unit for processing the frames in a processing area located between the start point and the end point of the carrying line;

a controller for controlling the operation of each carrier;

a base for supporting the first and second carriers; and a third stage for moving the base in the direction perpendicular to the carrying line, wherein the controller adjusts an interval between the carrying line and each of the holding members by moving the third stage.

19. The carrying system according to claim 18, further comprising a first magazine provided at the start point of the carrying line for holding a plurality of frames and a second magazine provided at the end point of the carrying line for receiving processed frames.

* * * * *